United States Patent [19]
Yokota

[11] Patent Number: 5,789,280
[45] Date of Patent: Aug. 4, 1998

[54] LEADFRAME HAVING SECURED OUTER LEADS, SEMICONDUCTOR DEVICE USING THE LEADFRAME AND METHOD OF MAKING THEM

[75] Inventor: Eiji Yokota, Sendai, Japan

[73] Assignee: Motorola, Inc., Schaumburg, Ill.

[21] Appl. No.: 688,078

[22] Filed: Jul. 29, 1996

Related U.S. Application Data

[62] Division of Ser. No. 536,878, Sep. 29, 1995, abandoned.

[30]     Foreign Application Priority Data

Oct. 11, 1994   [JP]   Japan .................................. 6-245450

[51] Int. Cl.⁶ ...................................................... H01L 21/40
[52] U.S. Cl. ............................................ 438/123; 438/112
[58] Field of Search ..................................... 437/209, 211, 437/214, 217, 219, 220; 438/123, 112

[56]     References Cited

U.S. PATENT DOCUMENTS

| | | | |
|---|---|---|---|
| 5,104,827 | 4/1992 | Schneider et al. | 437/220 |
| 5,258,331 | 11/1993 | Masumoto et al. | 437/220 |
| 5,286,680 | 2/1994 | Cain | 437/220 |
| 5,378,656 | 1/1995 | Kajihara et al. | 438/123 |
| 5,410,804 | 5/1995 | Berendts | 437/220 |
| 5,429,992 | 7/1995 | Abbott et al. | 438/123 |
| 5,633,205 | 5/1997 | Tsuchiya et al. | 438/123 |

*Primary Examiner*—Kevin Picardat
*Attorney, Agent, or Firm*—Rennie William Dover

[57]     ABSTRACT

A method of making a leadframe and a semiconductor device using the leadframe. The leadframe has a plurality of outer leads. Linking isolation members are located in the direction crossing to the extension direction of the outer leads so as to connect the neighboring outer leads with each other.

5 Claims, 10 Drawing Sheets

LEADFRAME HAVING SECURED OUTER LEADS, SEMICONDUCTOR DEVICE USING THE LEADFRAME AND METHOD OF MAKING THEM

This is a division of application Ser. No. 08/536,878, filed Sep. 29, 1995 now abandoned.

FIELD OF THE INVENTION

The present invention relates to a semiconductor device, and in particular, to a semiconductor device of surface mount type in which outer leads being led out from a package for burying therein and enveloping a semiconductor chip or an integrated circuit are connected with a surface of a mounting board in contact with the surface. The invention also relates to a leadframe having outer leads shaped in the form of a film or plane. Furthermore, the invention relates to a method of making the semiconductor device and the leadframe.

BACKGROUND OF THE INVENTION

In order to mount a semiconductor device (e.g., so-called LSI) formed of, for example, a plastic encapsulating package, onto a printed circuit board (PCB) or printed wiring board (PWB), various configurations of outer leads being led out from the package are employed. Recently, rather than a lead configuration of insertion type in which outer leads are passed through the printed circuit board and secured thereto, a lead configuration of surface mount type (such as a gull-wing configuration shown in FIG. 1A has been predominant in which outer leads are contacted and secured to the surface of the printed circuit board.

Figures 1A, 1B, 2, 3, 4:
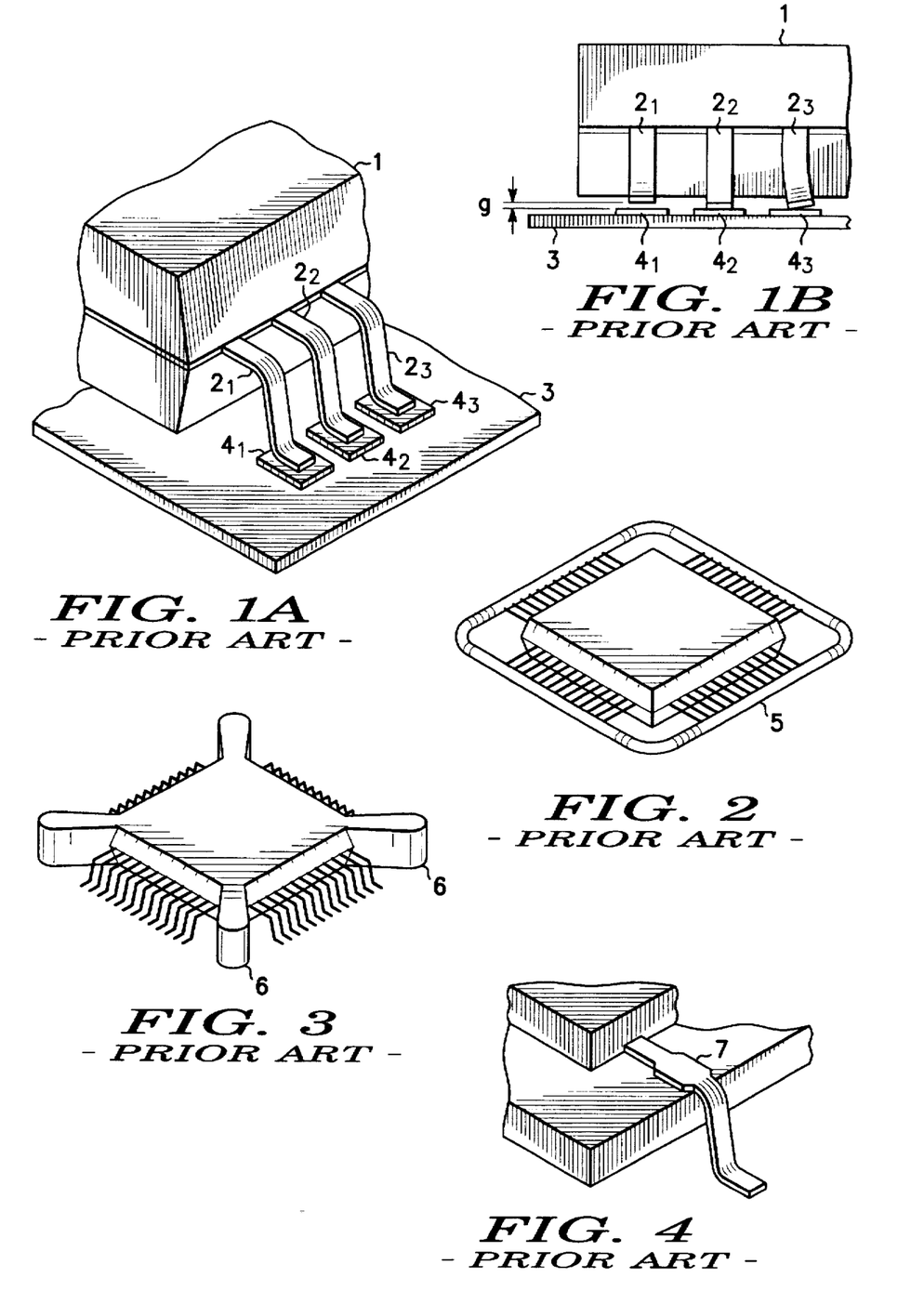
FIG. 1A is a partial perspective view illustrating a semiconductor device having conventional gull-wing-shaped outer leads.
FIG. 1B is a side view of the semiconductor device of FIG. 1A.
FIG. 2 is a perspective view illustrating a semiconductor device where a method based on MCR is employed.
FIG. 3 is a partial perspective view illustrating a semiconductor device where a method based on BQFP is employed.
FIG. 4 is a partial perspective view illustrating a semiconductor device where a method based on QFP with test pads is employed.

In FIG. 1A, outer leads $2_1$, $2_2$, $2_3$, . . . being led out from a package 1 are bent toward the mounting surface of a printed circuit board 3 and formed so that the contact surface of the leads are in close contact to footprints (pads) $4_1$, $4_2$, $4_3$, . . . of the printed circuit board.

The outer leads of such a typical gull-wing configuration may easily deform when an external force is applied thereto, because its shape is complex and no consideration is given to supporting this shape. Thus, as shown in FIG. 1B where it is seen along the lead-leading direction, coplanarity of the leads (uniformity of the contact surface at the lead tip) is poor, and the leads might not sit squarely on the footprints (as in the case of outer lead $2_1$, there occurs a gap, g, between the lead mounting surface and footprint $4_1$, or as in the case of outer lead $2_3$, the area in contact with footprint $4_3$ is small), so that an open failure may occur at the solder joint between the lead and footprint during mounting. Especially, the narrower the lead pitch, the more significant this problem.

To solve the problem, the following three techniques were employed conventionally:

(1) MCR (Molded Carrier Ring or GQFP (Guard ring Quad Flat Package)-based method (see FIG. 2.)

With this method, a ring 5 is provided which surrounds and connect the entire tip portion of each lead extended linearly from the package (or nearly in parallel to the top or bottom of the package if the package body is in the form of a parallel plane), so that the reinforcement by this ring prevents the deformation of the leads due to external forces. In a semiconductor device having such a ring, the leads are protected (and thus the deformation of the leads during transit of the device is also prevented) by the ring, from the completion of the device up to its mounting onto the printed circuit board; however, during mounting, it is necessary to machine the leads to a predetermined lead configuration as shown in FIG. 1A. Therefore, provision of the ring causes the external dimensions of the semiconductor device to be increased, resulting in cost disadvantage. Although the lead configuration could be protected immediately before mounting, the leads may be deformed depending on the lead machining process during mounting. This means that, from the standpoint of the mounting stage, the device is completed as a semi-finished product, and the mounting condition is determined wherein final product quality is determined by machining the leads during mounting. As such, greater exactness is demanded during the mounting stage.

(2) BQFP (Bumper Quad Flat Package)-based method (see FIG. 3.)

With this method, bumpers 6 for protecting the leads are provided at four corners of a package to avoid deformation thereof. However, it is quite likely that those leads lying near the center between the bumpers where protection of the bumpers are hard to reach might be affected by external forces.

(3) Method based on QFP with test pads (see FIG. 4.)

This method includes cases where the above-described method (1) or (2) is applied; while the tester pin is contacted to each lead during operational test after mounting, this method copes with pressing and deforming of the lead. A testing pad 7 is formed in the lead extending from the edge of the package. During the packaging process, X and Y (vertical and horizontal) dimensions of upper and lower cavities of a packaging die are changed, and such a test pad is disposed in a portion corresponding to the resulting dimensional difference. During testing, a tester pin is contacted near point p of the center of the test pad. Because this reinforces the strength of the area in contact with the tester pin, and the tester pin is contacted to that reinforced area, it prevents deformation of the lead due to pressure of the tester pin. However, the manufacture of a leadframe for a package having such a pad has disadvantages that it calls for a fine-machining technique and that the pad may be buried into the resin of the package.

Accordingly, it is an object of the present invention to provide a leadframe and semiconductor device that supports a narrower lead pitch, and a method of making them. It is another object of the present invention to prevent the deformation of leads, improve the coplanarity of the mounting contact surface of the leads, and easily mount them without imposing a burden on the mounting stage. It is still another object of the present invention to readily conduct after-mounting operational tests without changing a typical test setup.

SUMMARY OF THE INVENTION

A semiconductor device according to the present invention comprises: a semiconductor element; a package for encapsulating said semiconductor element; and a plurality of outer leads being connected with said semiconductor element and extending from said package, which is characterized by: a linking isolation member being located in a direction crossing to the extension direction of said outer leads and connecting adjacent ones of said outer leads with each other.

A method of making a semiconductor device according to the present invention, said semiconductor device comprising a semiconductor element; a package for encapsulating said semiconductor element; and a plurality of outer leads being connected with said semiconductor element and extending from said package, comprises the steps of: disposing and affixing said semiconductor element onto an island portion of a leadframe; placing at least said island portion and said semiconductor element between a pair of molding halves and surrounding said island portion and said semiconductor element to form a mold cavity; injecting a molten plastic material into said mold cavity, wherein each of said molding halves has a main cavity forming dent in its center, said main cavity forming dent surrounding said island and said semiconductor element, and at least one of said molding halves has a sub-cavity forming dent, said sub-cavity forming dent being linked to a portion of said main cavity forming dent, separated from a periphery of said main cavity forming dent and extending therealong.

Further, a leadframe according to the present invention has outer leads, and is characterized by two patterns for connecting each of said outer leads in a direction crossing to the extension direction of said outer leads.

A method of making this leadframe according to the present invention, said leadframe having outer leads, is characterized by: in an etching step for forming said outer leads on a leadframe substrate, forming two patterns which connects each of said outer leads in a direction crossing to the extension direction of said outer leads.

A method of making a semiconductor device according to the present invention, utilizes the above-described leadframe and comprises the steps of: disposing a semiconductor element on said leadframe; encapsulating the leadframe having said semiconductor element disposed thereon; after the step of encapsulating, shaping each of said outer leads by cutting two patterns, said patterns connecting each of said outer leads in a direction crossing to the extension direction of said outer leads.

Another leadframe according to the present invention has outer leads, and is characterized by a linking isolation member being located in a direction crossing to the extension direction of said outer leads and connecting adjacent ones of said outer leads with each other.

A method of making this leadframe having outer leads, according to the present invention, comprises the steps of: etching to form said outer leads on a leadframe substrate; after said step of etching, forming a linking isolation member, said linking isolation member located in a direction crossing to the extension direction of said outer leads and connecting adjacent ones of said outer leads with each other.

According to the inventive leadframe and semiconductor device and the method of making them, a linking isolation member which is located in a direction crossing to the extension direction of a plurality of outer leads that extends from the package and which connects adjacent ones of said outer leads with each other makes the outer leads less deformable.

DESCRIPTION OF A PREFERRED EMBODIMENT

The present invention will be described in greater detail with reference to the drawings.

Figure 5:
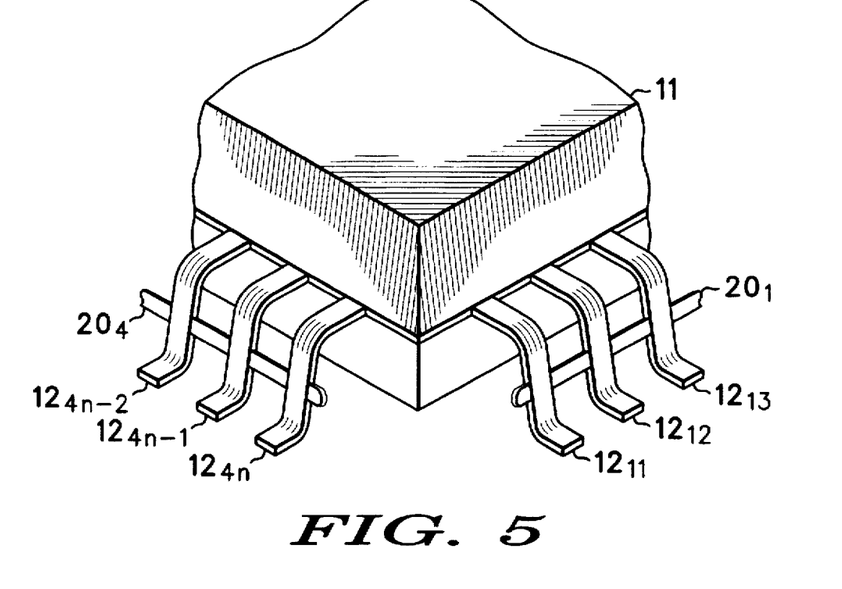
FIG. 5 is a partial perspective view of a QFP semiconductor device according to one embodiment of the present invention.

FIG. 5 is an partial external view of a QFP semiconductor device according to one embodiment of the present invention.

In FIG. 5, each of outer leads $12_{11}, 12_{12}, 12_{13}, \ldots, 12_{4n-1}, 12_{4n}$ extending from a plastic package body 11 approximately in the form of a parallel plane, which buries and encapsulates a semiconductor element or IC chip has a gull-wing configuration. Between a first point of the outer lead 12 bending from the package side (first bending point) and a second bending point are provided, as lead holding sections, electrically insulative linking member $20_1, 20_2, 20_3$ and $20_4$ formed of a resin such as, for example, plastic equivalent to that used in the body 11, for each side of the package; these linking insulation members connect adjacent ones of the outer leads with each other, thereby preventing deformation of the leads due to external forces.

This reinforces the structure of the outer leads, thus making it hard to deform, and also improves the coplanarity of the mounting contact surface. When mounted together with the linking isolation member to the printed circuit board, the mounting contact surface formed by the contact surface of the outer leads corresponds to the printed wiring surface on the printed circuit board. Additionally, because the strength of the outer leads is maintained by the linking isolation members after mounting, the outer leads are hard to deform due to pressures of tester pins during operational tests where tester pins are brought into contact with them. There is another advantage that a conventional testing procedure may not be changed. Furthermore, a cost advantage is achieved as compared to the afore-described MCR method. In addition, by forming the package body 11 and linking members $20_1$ and $20_4$ with the same material, they can be formed in a single molding step, resulting in another cost advantage.

Next, a method of making a semiconductor device including the leadframe 20 is described according to the present invention.

Figure 6:
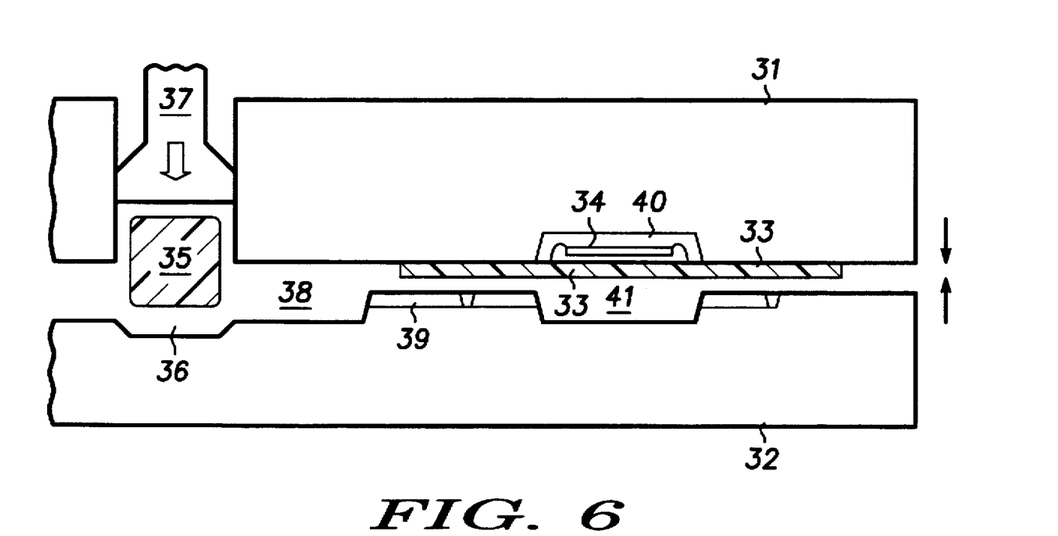
FIG. 6 is a cross-sectional view illustrating the structure of a mold that complies with a low-pressure transfer molding method to implement one example of the inventive semiconductor device fabrication method, and the configuration of the leadframe having a semiconductor chip mounted thereon.

FIG. 6 is a schematic cross-sectional view illustrating a structure of a transfer die, or a mold for packaging the present semiconductor device by means of a so-called low-pressure transfer molding technique, and also illustrating the configuration of the leadframe having a semiconductor chip mounted thereon.

In FIG. 6, according to such a molding method, a leadframe 33 and semiconductor chip 34 to be encapsulated are secured and sandwiched in a predetermined location by molds (upper mold 31 and lower mold 32) preheated at a certain temperature; tablet-shaped resin 35 is high-frequency heated and so on, and filled in a cull hole 36, and a transfer plunger 37 is operated to melt and inject the resin under pressure into upper and lower cavities 40 and 41 through runner 38 and gate 39.

Figure 7:
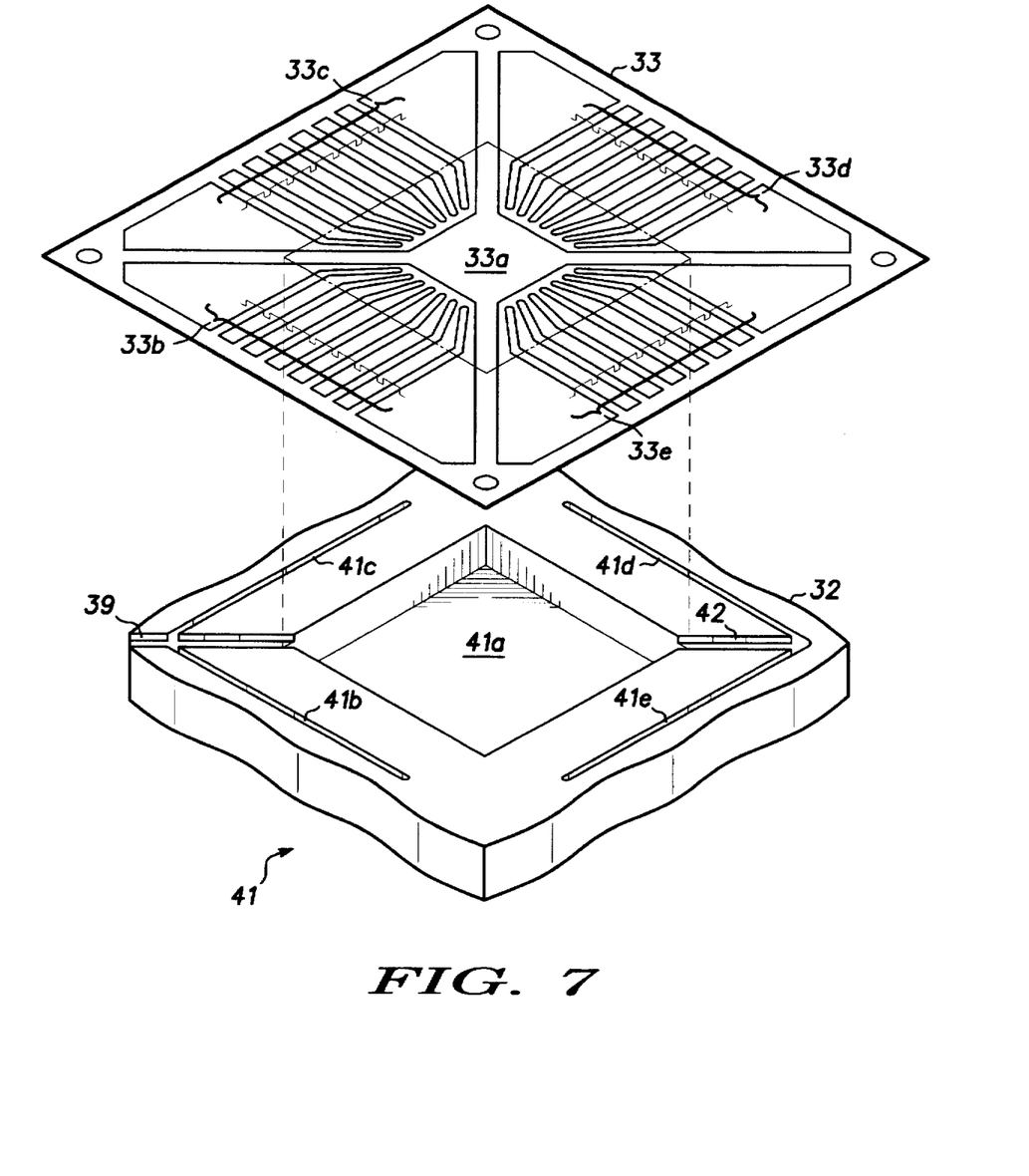
FIG. 7 is an exploded perspective view illustrating the structure of the lower cavity, and the arrangement of the leadframe relative to the lower die.
Figure 8:
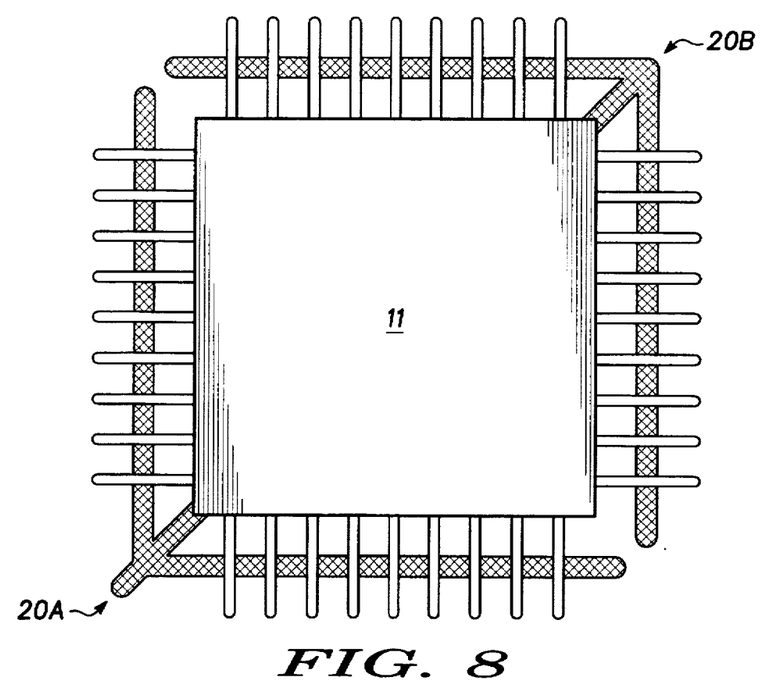
FIG. 8 is a plan view seen from the top of the package of the semiconductor device after resin encapsulation.
Figure 9:
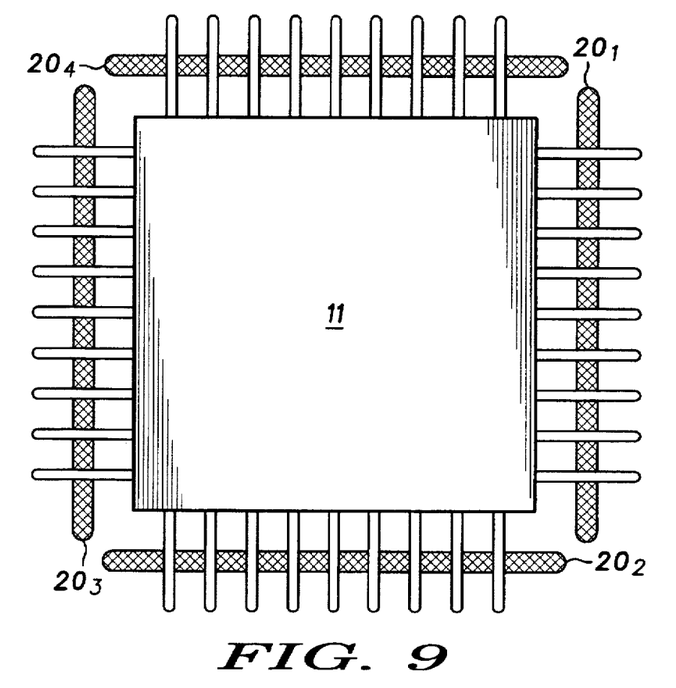
FIG. 9 is a plan view seen from the top of the package of the semiconductor device after the cutting step.

Reference should now be made to FIGS. 7–9 for further detailed explanation of the method of making the semiconductor device.

FIG. 7 is an illustration showing the structure of the cavity 41 in FIG. 6 and arrangement of the leadframe 33 relative to the lower mold 32.

Such a cavity is comprised of a portion 41a for encapsulating the package bottom of the leadframe (thus forming a bottom body of the finished package); grooves 41b and 41c extending through the body forming portion 41a and gate 39 and formed along and spaced a predetermined distance away from first and second sides (edges) of the body forming portion 41a; and grooves 41d and 41e extending through the body forming portion 41a and bend 42 and formed along and similarly spaced a predetermined distance away from third and fourth sides (edges) of the body forming portion 41a. During encapsulation with the upper and lower dies, the body forming portion 41a provides a main-cavity forming dent, while the grooves 41b, 41c, 41d, and 41e provides sub-cavity forming dents. The semiconductor chip (not shown) is mounted on an island 33a of the leadframe 33, and is subjected to predetermined process steps (connection, wire-bonding, etc.).

During resin melting and pressure injection, the resin injected from the runner 38 is injected into each cavity 41a, 41b, 41c, 41d, and 41e through the gate 39. The injected resin is supplied to the grooves 41d and 41e via the body forming portion 41a. The leadframe 33 is encapsulated at one side by the resin filled in the cavity at the location indicated by an alternate long and short dash line in the figure. Thus, the externally extending leads (i.e., outer leads) 33b, 33c, 33d, and 33e of the leadframe 33 abut each groove as it crosses the extending direction as indicated by the band-shaped hatched area.

Thus, as shown in FIG. 8, in the middle of the outer leads, they are linked with each other by a rod-shaped resin piece formed in each groove by resin encapsulation, that is, a linking member. It should be noted that unnecessary patterns are cut from the leadframe in this stage.

For the package top of the leadframe, when the package body is similarly resin encapsulated, unnecessary portions of the rod-shaped resin piece are cut as shown in FIG. 9 (portion 20A and 20B portions in FIG. 8), and divided for each side of the package. Thus, this rod-shaped resin piece provides lead holding sections $20_1$, $20_2$, $20_3$, and $20_4$. It should be noted that FIGS. 8 and 9 represent views seen from the top of the package.

Eventually, the outer leads are shaped into a gull-wing configuration, as represented by outer lead 12 in FIG. 5, thereby completing the fabrication process for the semiconductor device having the lead holding sections.

To efficiently make the semiconductor device of the present invention, a leadframe may be first fabricated before packaging, as described below.

Figure 10:
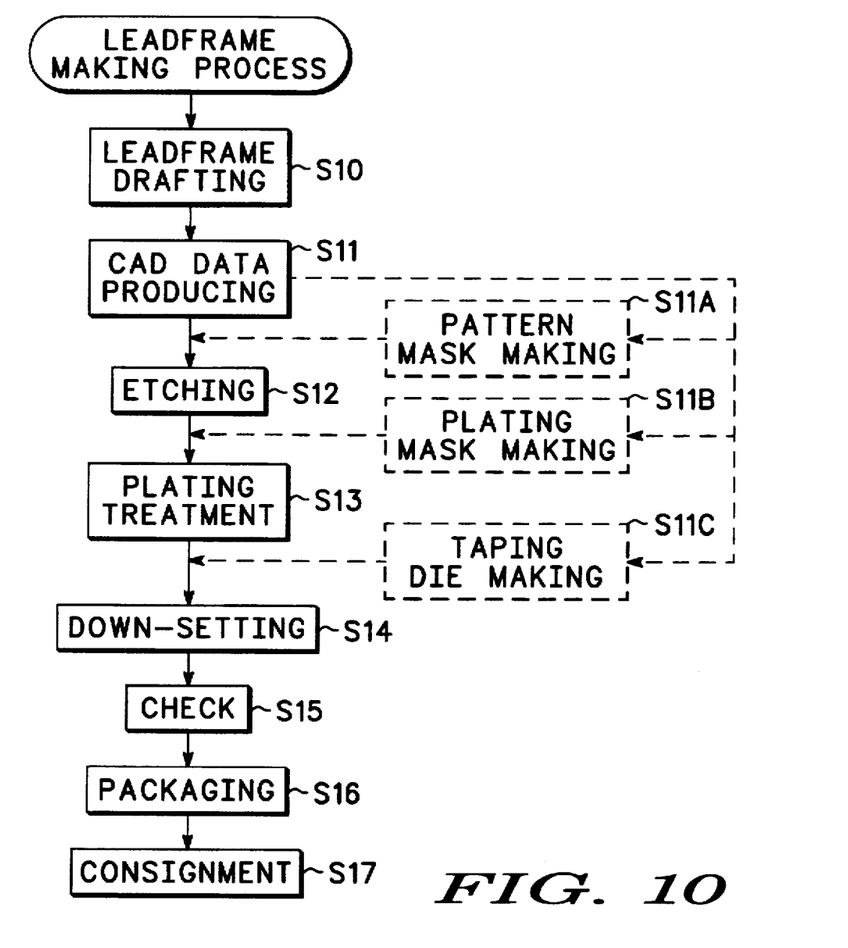
FIG. 10 is a flow chart depicting one embodiment of the leadframe fabrication process according to the present invention.

FIG. 10 shows one example of fabrication steps for a leadframe according to the present invention, in which a pattern drawing for a leadframe to be made is drafted, for example, on paper (step S10). Then, according to this pattern drawing, data is input into a CAD (Computer-Aided Design) system to produce CAD data (step S11). Based on the resulting data, a pattern mask is made (step S11A), and a plating mask and a taping die are made, respectively (steps S11B and S11C).

Figure 11:
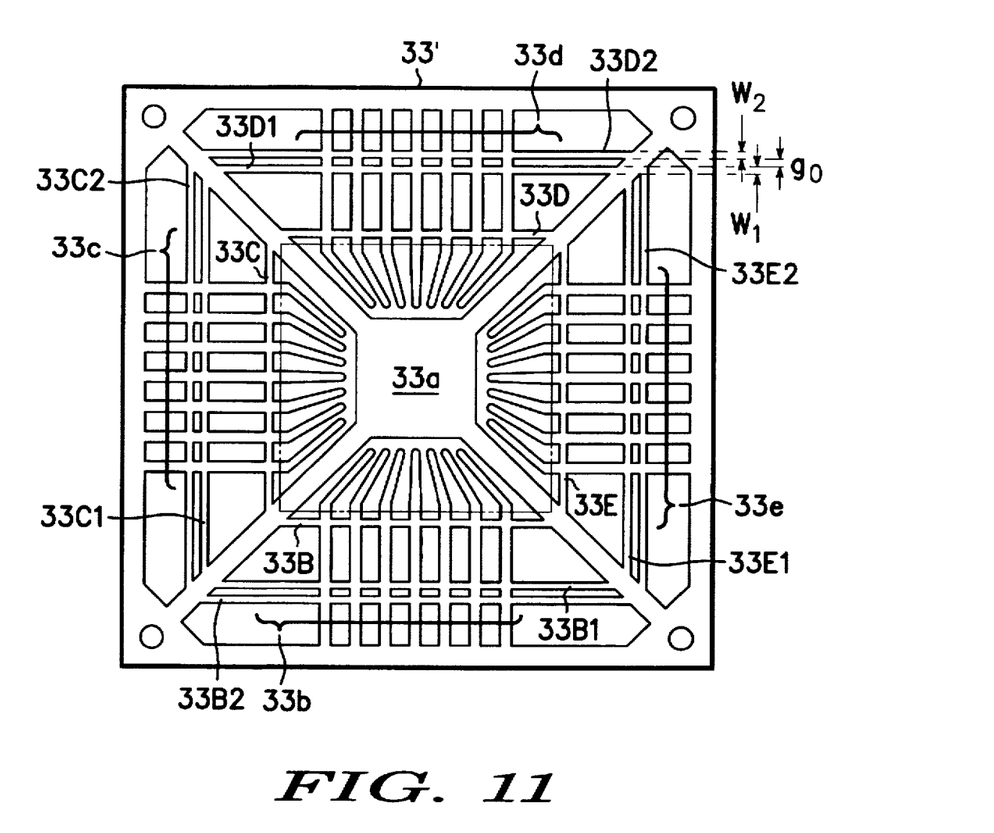
FIG. 11 illustrates a schematic conductor pattern for the leadframe formed by the etching step in the leadframe fabrication process of FIG. 10.

After the CAD data is created in step S11 and the pattern mask is made in step S11A, the routine proceeds to an etching step S12. In this step, a leadframe as shown in FIG. 11 is formed by a so-called etching process. Note that FIG. 11 schematically illustrates individual patterns of the leadframe including the shape and number of inner and outer leads. It is understood that like parts of FIG. 7 are denoted by similar reference numerals, and the area defined by an alternate long and short dash line corresponds to the package body forming location. With this leadframe, in addition to dam bars (tie-bars) 33B, 33C, 33D, and 33E for stopping the flow of molding resin, which are formed along the edge of the body forming area, outer leads are doubly connected along a direction crossing to the extension direction of the outer leads 33b, 33c, 33d, and 33e in the middle of them. If two rod-shaped joint portions (patterns) 33B1 and 33B2, 33C1 and 33C2, 33D1 and 33D2, and 33E1 and 33E2 are referred to as first and second resin guide bars, respectively, then widths $w_1$ and $w_2$ of each guide bar should preferably be made small enough to facilitate subsequent lead shaping steps described later. Additionally, because resin, which provides a lead holding section, is formed between the guide bars during the encapsulation step, gap go should preferably be set appropriately depending on the strength of the resin used and so on.

Once the leadframe 33' shown in FIG. 11 is formed as a result of step S12, the inner lead (a pattern that links the dam bar near to the island) is plated (step S13) using the plating mask made in step S11B; then, using the taping die made in step S11C, the island 33a of the leadframe is down-set to provide a dent for placing a semiconductor chip thereon (step S14). Subsequently, after the steps of inspection (step S15) and packaging (step S16), the routine proceeds to consignment (step S17).

It should be appreciated that while steps S11A, S11B and S11C are described as intermediate steps, the rest are described as direct steps.

Figure 12:
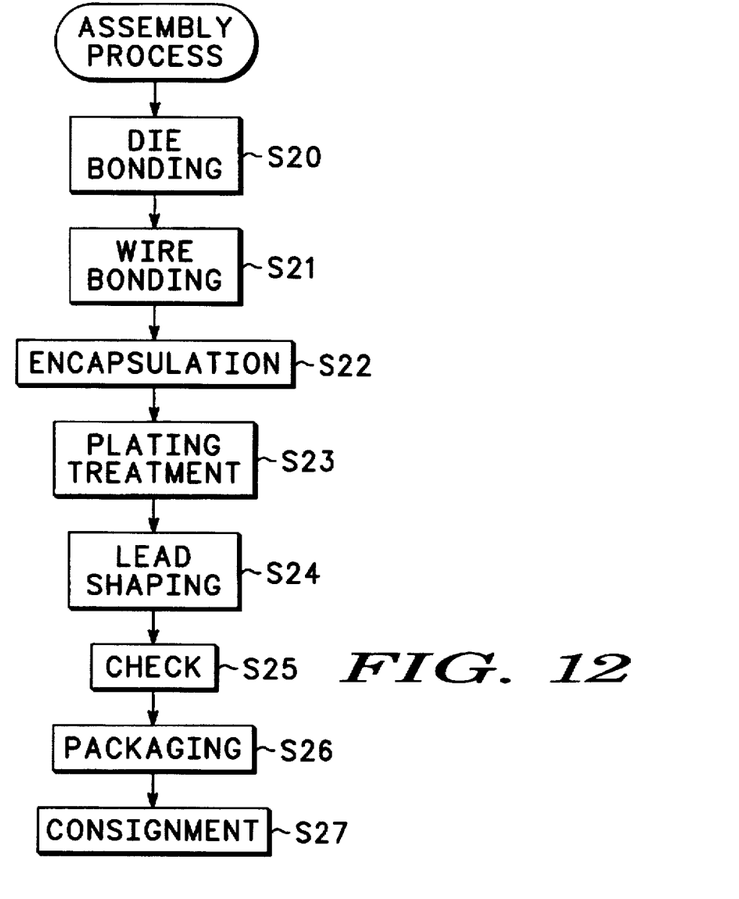
FIG. 12 is a flow chart depicting one embodiment of the assembly process according to the present invention.

The leadframe 33' so fabricated is transferred to an assembly process illustrated in FIG. 12. Indeed, this transfer may be immediately done after inspection step S15 in FIG. 10.

In this assembly process, first die-bonding (step S20) is performed to affix the semiconductor chip to the leadframe, and another wire-bonding (step S21) is performed to connect the input/output pads of the chip affixed to their corresponding inner lead ends.

Figure 13A:
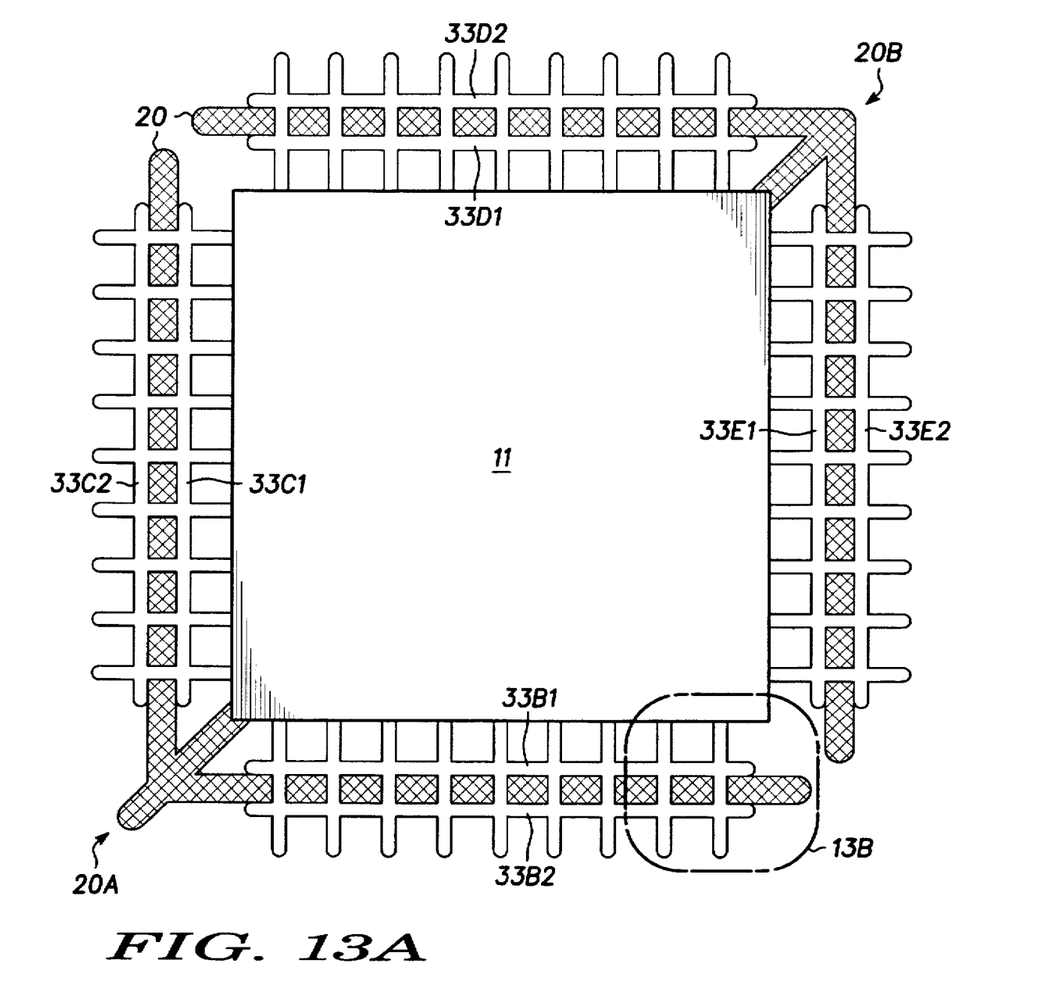
FIG. 13A depicts how the cutting step is performed by the lead shaping step in the assembly process of FIG. 12.
Figure 13B:
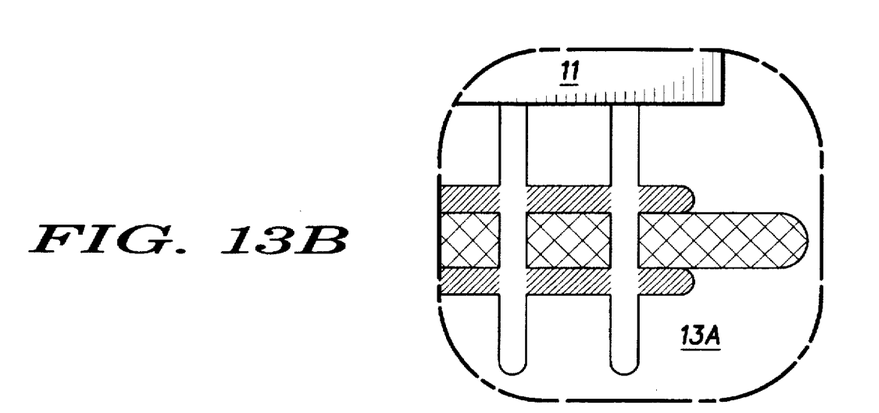
FIG. 13B is an expanded view of region 13A of FIG. 13A.

After bonding, the routine proceeds to an encapsulation step S22. In this step, the leadframe having the semiconductor chip affixed thereto is encapsulated in such a manner described in FIGS. 6 and 7. The band-shaped hatched area in FIG. 7 corresponds to the guide bar gap ($g_o$) in FIG. 11. Thus, as shown in FIGS. 13A and 13B, the gaps between guide bars 33B1 and 33B2, between guide bars 33C1 and 33C2, between guide bars 33D1 and 33D2, and between guide bars 33E1 and 33E2 are all covered by the resin 22. This completes the connection between the outer leads.

After the encapsulation step S22, the outer leads are plated (step S23), and the routine proceeds to a lead shaping step S24. This step includes a step of cutting the guide bars so that the outer leads are left intact, thereby removing unnecessary portions around the outer leads. In other words, as shown in FIGS. 13A and 13B, not only are unnecessary portions cut from the linking resin piece 20, but the guide bars indicated by oblique lines in an enlarged view are also removed from the leads exposed from the package body 11. This leaves a finished product as shown in FIG. 9. Additionally, in this shaping step, the outer leads, which have the guide bars removed, are shaped and finished into a gull-wing configuration.

Once the outer leads are shaped in step S24, the routine proceeds to the steps of inspection (S25), packaging (S26) and consignment (S27).

On the other hand, the linking resin piece may not be formed at the same time with the packaging, i.e., resin encapsulation of the leadframe having the semiconductor chip mounted thereon, as described above; but the linking resin piece may be formed during the fabrication of the leadframe, as described below.

Figure 14:
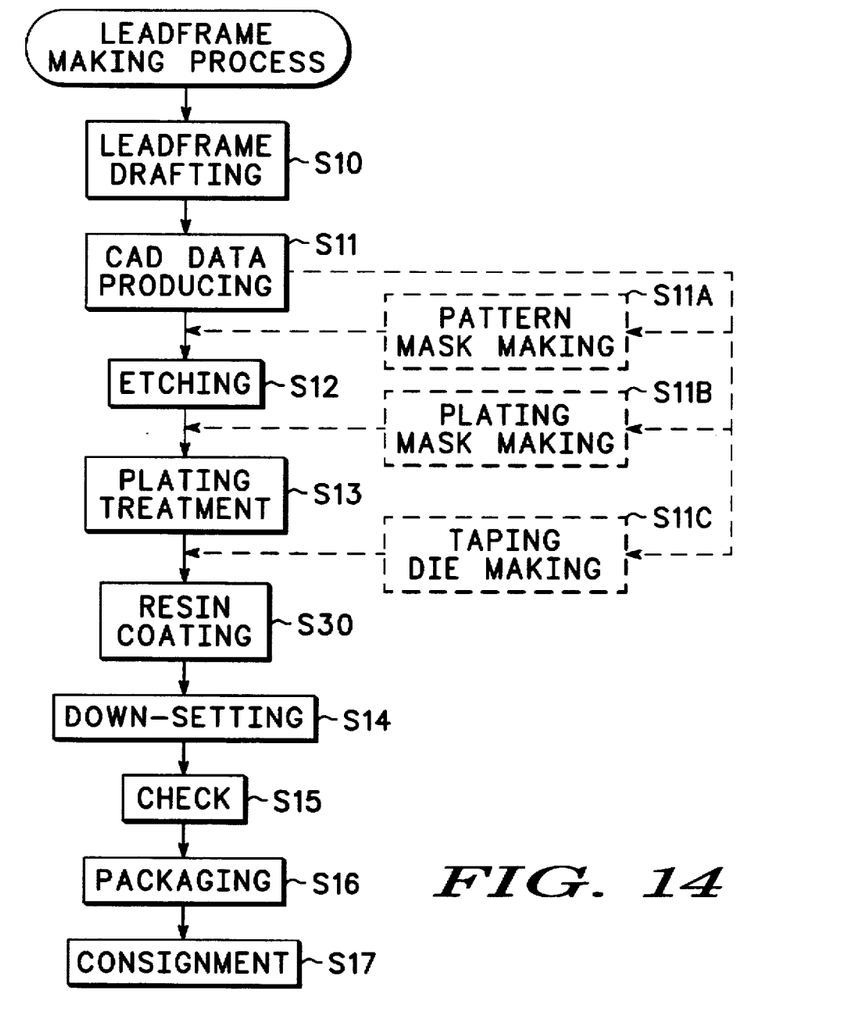
FIG. 14 is a flow chart depicting another embodiment of the leadframe fabrication process according to the present invention.
Figure 15:
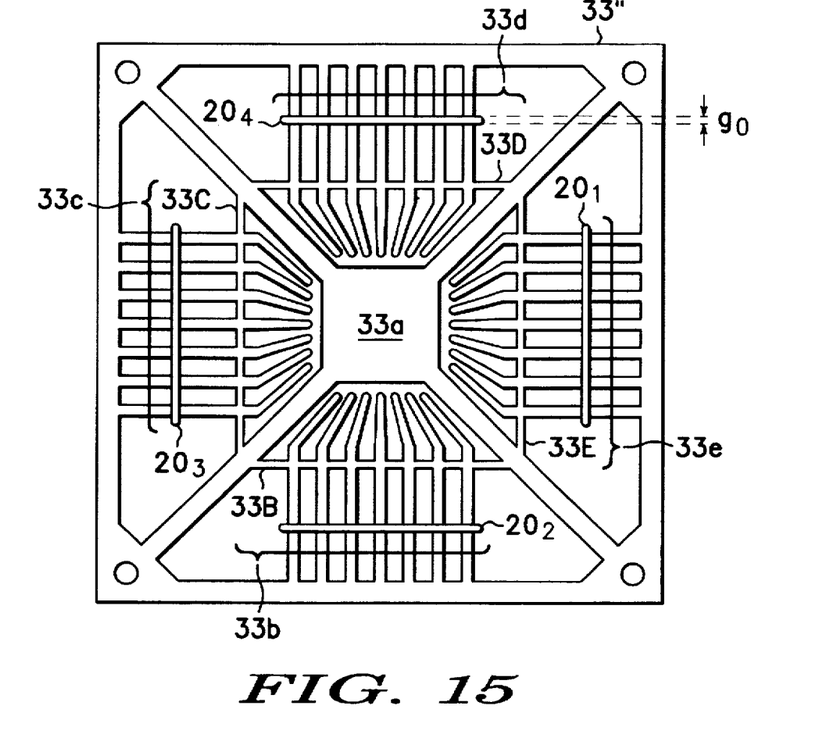
FIG. 15 illustrates a schematic conductor pattern for the leadframe together with the linking resin formed by the resin coating step in the leadframe fabrication process of FIG. 14.

FIG. 14 illustrates a leadframe fabrication process for achieving such a configuration, where like parts are denoted by the same reference numerals. According to this process, after the plating treatment step S13, the routine proceeds to the down-setting step S14 through the resin coating step S30, where the linking member is formed. The leadframe fabricated up to the plating treatment step S13 has no guide bars provided as described above. In the resin coating step S30, linking resins $20_1$, $20_2$, $20_3$, and $20_4$ are immediately formed on the plated leadframe as shown in FIG. 15. More specifically, resin is coated in a direction crossing to the extension direction of the outer leads 33b, 33c, 33d, and 33e, thereby forming linking resins.

Figure 16:
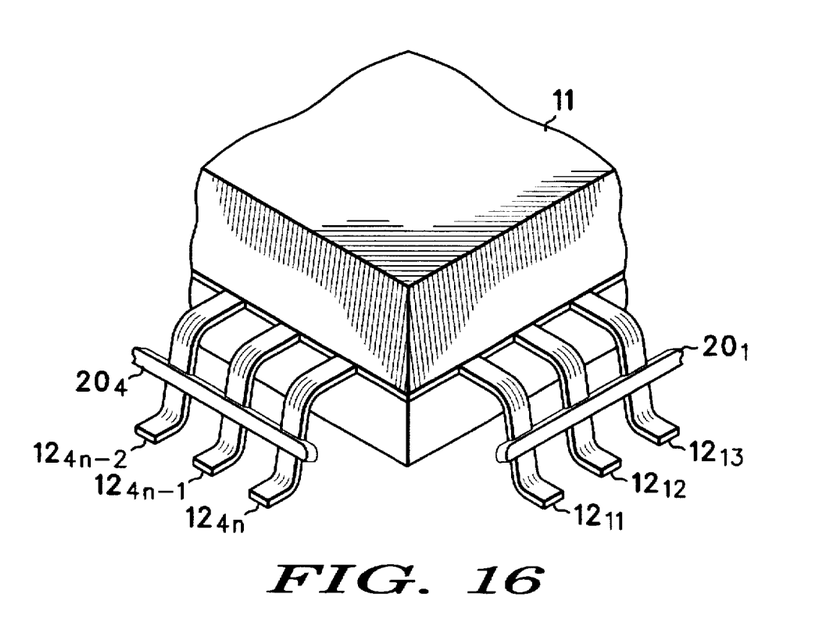
FIG. 16 is a simplified view illustrating a semiconductor device made using the leadframe fabricated with the leadframe fabrication process of FIG. 14.

In this way, because completed linking resins are formed onto a typical leadframe itself regardless of its packaging, the need for the lead shaping step described in FIGS. 8 and 9 or FIG. 13A is eliminated. Additionally, the die or method used to the form the linking resins as illustrated in FIGS. 6 and 7 may not be utilized, but a typical assembly process may be used advantageously. It should be noted that because each linking resin is coated on the surface of the leadframe (side where the semiconductor chip is affixed), the finished product after packaging is as shown in FIG. 16. This configuration is different from that shown in FIG. 5, but it is apparent that it may offer substantially equivalent benefits. Thus, each linking resin may be coated and formed on the back side of the leadframe, as shown in FIG. 5; by further modification, each linking resin may be formed on both front and back sides of the leadframe. The resulting configuration does not become dependent on the coating step S30 in FIG. 14, but may be realized by adjusting the die or technique for simultaneous resin formation with packaging as illustrated in FIGS. 6 and 7, as far as it can be done by those skilled in the art.

Although the lead holding sections are formed by the same resin as the package in each of the above embodiments, it is, of course, appreciated that any electrically insulating material having sufficient strength to prevent deformation of the leads may be used. The present invention may be applicable not only to the QFP type but also to various other types such as DIP, and not limited to the extension direction of outer leads. Also, the present invention is not limited to plastic encapsulation, but may be applicable to various encapsulation techniques. Furthermore, the present invention is not limited to connecting the rod-shaped insulator to the outer leads through the die as shown in FIG. 7; and, although for the connection of the rod-shaped insulator, the outer leads are connected from the bottom of the package to the leadframe during resin encapsulation in the above embodiment, the outer leads may be connected from the top.

As described above, according to the inventive leadframe having outer leads connected thereto and semiconductor device, and method of making them, a linking isolation member located in a direction crossing to the extension direction of a plurality of outer leads extending from the package and connecting adjacent ones of the outer leads with each other makes the outer leads less deformable, thus preventing deformation of the leads and improving the coplanarity of the lead mounting contact surface, without imposing a burden on the mounting stage to facilitate mounting. In addition, operational tests can be readily performed after mounting, without changing a typical test procedure. Accordingly, the present invention provides a leadframe and semiconductor device amenable to a narrower lead pitch, and a method of making them.

What is claimed is:

1. A method of making a leadframe, said leadframe having outer leads, characterized by:

in an etching step for forming said outer leads on a leadframe substrate, forming two patterns which connects each of said outer leads in a direction crossing to the extension direction of said outer leads; and coating resin between the two patterns.

2. A method of making a semiconductor device utilizing a leadframe, the leadframe characterized by two patterns for connecting each of said outer leads in a direction crossing to the extension direction of said outer leads, said method comprising the steps of:

disposing a semiconductor element on said leadframe;

encapsulating the leadframe having said semiconductor element disposed thereon;

after the step of encapsulating, shaping each of said outer leads by cutting two patterns, said patterns connecting each of said outer leads in a direction crossing to the extension direction of said outer leads.

3. A method according to claim 2, wherein said step of encapsulating comprises the step of:

placing at least an island portion of said leadframe and said semiconductor element between a pair of molding halves and surrounding said island portion and said semiconductor element to form a mold cavity; and injecting a molten plastic material into said cavity, wherein each of said molding halves has a main cavity-forming dent in its center, said main cavity forming dent surrounding said island and said semiconductor element, and at least one of said molding halves has a sub-cavity forming dent for forming a linking member, said sub-cavity forming dent being linked to a portion of said main cavity forming dent, separated from a periphery of said main cavity forming dent and extending therealong, and wherein said sub-cavity forming dent is located between said two patterns formed on said leadframe.

4. A method according to claim 2, including the step of shaping said outer leads into a gull-wing configuration.

5. A method of making a leadframe having outer leads, said method comprising the steps of:

etching to form said outer leads on a leadframe substrate;

after said step of etching, forming a linking isolation member, said linking isolation member located in a direction crossing to the extension direction of said outer leads and connecting adjacent ones of said outer leads with each other, wherein in said step of forming a linking isolation member, said linking isolation member is formed by coating liquid resin in the middle of said outer leads in a direction crossing to the extension direction of said outer leads.

* * * * *